(12) United States Patent
Fober (10) Patent No.: US 8,390,152 B2
(45) Date of Patent: Mar. 5, 2013

(54) DEVICE AND METHOD FOR GENERATING A STABLE HIGH VOLTAGE

(75) Inventor: Jorg Fober, Heuchlingen (DE)

(73) Assignee: Carl Zeiss NTS GmbH, Oberkochen (DE)

( * ) Notice: Subject to any disclaimer, the term of this patent is extended or adjusted under 35 U.S.C. 154(b) by 271 days.

(21) Appl. No.: 12/660,683

(22) Filed: Mar. 2, 2010

(65) Prior Publication Data
US 2010/0296320 A1 Nov. 25, 2010

(30) Foreign Application Priority Data
Mar. 6, 2009 (DE) .................. 10 2009 011 511

(51) Int. Cl.
*G01R 19/12* (2006.01)
(52) U.S. Cl. ............................................. 307/152
(58) Field of Classification Search .............. 307/152
See application file for complete search history.

(56) References Cited

U.S. PATENT DOCUMENTS
3,533,010 A * 10/1970 Bowles ............... 331/75

FOREIGN PATENT DOCUMENTS
| DE | 44 33 531 C2 | 12/1997 |
| DE | 44 33 524 C2 | 1/1999 |
| JP | 2008-125325 A | 5/2008 |

OTHER PUBLICATIONS

Kind, Dieter, *Einführung in die Hochspannungs-Versuchstechnik* [= Introduction to High-Voltage testing Techniques] Braunschweig/Wiesbaden 1978, $2^{nd}$ ed., pp. 10, 11, 27.
Su, et al.: "A 600kV 15mA Cockcroft-Walton high-voltage power supply with high stability and low-ripple voltage", Nuclear Instruments & Methods in Physics Research Section A: Accelerators, Spectrometers, Detectors, and Associated Equipment, Elsevier BV North-Holland, Netherlands, ISSN: 0168-9002, May 10, 2006.

* cited by examiner

Primary Examiner — Robert L. Deberadinis
(74) Attorney, Agent, or Firm — Muirhead and Saturnelli, LLC (57) ABSTRACT

A device is disclosed for generating a stable high voltage, namely a high-voltage DC generator for a particle beam apparatus. A method is also disclosed for generating a stable high voltage for a particle beam apparatus. The high-voltage DC generator has a controllable voltage source, which is connected to an amplifier. The high-voltage DC generator ensures that fluctuations of the smoothed high voltage are detected by a capacitive divider and supplied to the amplifier. The amplifier controls the controllable voltage source in counterphase. The voltage of the controllable voltage source is superimposed on the smoothed high voltage. The sum of the voltage of the controllable voltage source and the smoothed high voltage forms the generated and stable high voltage, which is supplied to a particle beam apparatus.

13 Claims, 10 Drawing Sheets

DEVICE AND METHOD FOR GENERATING A STABLE HIGH VOLTAGE

TECHNICAL FIELD

This application relates to a device for generating a stable high voltage, namely a high-voltage DC generator for a particle beam apparatus, and to a method for generating a stable high voltage for a particle beam apparatus.

BACKGROUND OF THE INVENTION

A generator is a device which is capable of adjusting a voltage (such as a high voltage) by a specific value. The generator may simultaneously also be implemented as a voltage source (for example, as a high-voltage source). In other words, in this case the generator provides both the voltage (such as the high voltage) and also a possibility of adjusting this voltage by a specific value.

Particle beam apparatuses, such as electron beam apparatuses, have been used for some time for studying samples. In particular, scanning electron microscopes and transmission electron microscopes are known.

In a transmission electron microscope, electrons of an electron beam, which are generated using a beam generator, are directed onto a sample to be studied. A part of the electrons of the electron beam is scattered in the sample. Non-scattered electrons and the scattered electrons are detected and used either to generate images of the sample or to generate diffraction images of the sample.

Scanning electron microscopes are used to study surfaces of objects (samples). For this purpose, in a scanning electron microscope, an electron beam (also referred to hereafter as a primary electron beam) is generated using a beam generator and focused by an objective lens onto an object to be studied. The primary electron beam is scanned over the surface of the object to be studied using a deflection apparatus. The electrons of the primary electron beam interact with the object. As a result of the interaction, electrons are emitted from the object in particular (so-called secondary electrons) or electrons of the primary electron beam are backscattered (so-called backscattered electrons). The backscattered electrons have an energy in the range of 50 eV up to the energy of the electrons of the primary electron beam at the object, while the secondary electrons have an energy of less than 50 eV. Secondary and backscattered electrons form the subsequent so-called secondary beam and are detected using a detector. The detector signal thus generated is used for image generation.

In both previously described particle beam apparatuses, the electrons of the primary electron beam are accelerated to a specific energy. For this purpose, the beam generator is kept at a high voltage, for example, in the range of 0.02 kV to 30 kV for a scanning electron microscope and 20 kV to 200 kV for a transmission electron microscope. In order to achieve a desired resolution, setting the high voltage to a specific value is known. Furthermore, in order to achieve a good resolution in the final images provided by the particle beam apparatuses, it is desirable to keep the voltage applied to the beam generator as stable as possible.

A high-voltage DC generator for a particle beam apparatus is known which has an AC voltage source, which is set by an amplitude regulator via a desired target value of the high voltage and whose output voltage is supplied to a step-up transformer. The step-up transformer steps up the AC voltage. The output voltage of the step-up transformer is in turn supplied to a Cockroft-Walton generator, which multiplies the output voltage of the step-up transformer. The high voltage resulting in this way is smoothed via a filter or multiple filters made of resistors and capacitors and supplied via a measuring resistor to the amplitude regulator. Fluctuations of the smoothed high voltage are detected via a capacitive divider, which includes a first capacitor and a second capacitor, and supplied to an amplifier. The amplifier provides an output signal, which is supplied to the amplitude regulator and acts in counterphase to the fluctuations of the smoothed high voltage. In this way, the fluctuations of the smoothed high voltage are additionally damped.

The system described above has the disadvantage that the amplitude regulator tends toward oscillations. Considerations have shown that limits are thus set on the stabilization of the high voltage. Therefore, not every gain is possible and the maximum achievable stability of the high voltage is thus narrowly limited.

Reference is made, for example, to DE 44 33 531 A1 and DE 44 33 524 A1 in regard to the prior art.

It is therefore desirable to provide a system in which basically any desired high voltage may be stabilized.

SUMMARY OF THE INVENTION

According to the system described herein, a high-voltage DC generator for a particle beam apparatus, in particular an electron microscope, is provided with at least one Cockroft-Walton generator, at least one AC voltage source for supplying the Cockroft-Walton generator, and at least one amplitude regulator for setting the AC voltage source. Furthermore, at least one step-up transformer is provided, which is connected to the AC voltage source for supplying the step-up transformer with an output voltage of the AC voltage source. The high-voltage DC generator according to the system described herein may be additionally provided with at least one filter for smoothing a high voltage generated by the Cockroft-Walton generator, with at least one measuring resistor for supplying the high voltage smoothed by the filter to the amplitude regulator, with at least one capacitive divider for detecting fluctuations of the smoothed high voltage, and with at least one amplifier, which is connected to the capacitive divider to receive the detected fluctuations of the smoothed high voltage. In addition, a controllable voltage source, which is connected to the amplifier, is situated on the high-voltage DC generator according to the system described herein.

The high-voltage DC generator according to the system described herein ensures that fluctuations of the smoothed high voltages are detected by the capacitive divider and supplied to the amplifier. The amplifier controls the controllable voltage source in counterphase. The voltage of the controllable voltage source is superimposed on the smoothed high voltage. The sum of the voltage of the controllable voltage source and the smoothed high voltage forms the generated and stable high voltage which is supplied to the particle beam apparatus.

It is advantageous that, on the one hand, effective damping of interfering fluctuations of the smoothed high voltage is achieved. On the other hand, it is advantageous that the dynamics of the stabilization are not limited by the bandwidth of the amplitude regulator. Even higher-frequency interference may thus be effectively suppressed. Any desired high voltage may basically thus be stabilized.

In a first embodiment of the high-voltage DC generator described herein, at least one current measuring unit is provided for detecting a high-voltage load current, the step-up transformer being connected to the current measuring unit.

In a further embodiment of the high-voltage DC generator described herein, an output-side reference point of the controllable voltage source is the ground potential. Alternatively or additionally, the capacitive divider may be designed in such a way that the fluctuations of the smoothed high voltage are detected in relation to the ground potential.

In still a further embodiment of the high-voltage DC generator described herein, the capacitive divider is designed in such a way that the fluctuations of the smoothed high voltage are detected in relation to a virtual ground. For example, a reference signal close to the ground potential is provided as the virtual ground, which represents 0 V for the amplifier. The fluctuations of the smoothed high voltage thus detected are then supplied to the amplifier. The amplifier in turn controls, in counterphase, the controllable voltage source whose output-side reference point is the ground potential. In the previously described embodiment, the fluctuations of the smoothed high voltage are damped sufficiently well. In addition, the fluctuations do not "disappear" through the feedback of the smoothed high voltage. Only the sum which is formed by the fluctuations and the smoothed high voltage is practically zero. The total gain of amplifier and the controllable voltage source is calculated in this embodiment from the negative divider ratio of a second capacitor and a first capacitor, which form the capacitive divider. The product of the divider ratio and the total gain is thus precisely −1.

In a further embodiment of the high-voltage DC generator described herein, the amplitude regulator is settable using a target value for a desired high voltage. On the one hand, an embodiment is provided in which the amplitude regulator is exclusively settable using the target value for a desired high voltage. On the other hand, however, an embodiment is also provided in which the amplitude regulator is additionally settable via a further value. For example, the amplitude regulator is additionally settable using a target value for a change value of the high voltage. The change value is the value by which the high voltage is to be changed.

In still a further embodiment of the high-voltage DC generator described herein, a superposition voltage source is provided for superimposing the smoothed high voltage. For example, the superposition voltage source is implemented as a voltage source which allows the change in the high voltage by a specific value. For example, the superposition voltage source is connected between the capacitive divider and a tap of the smoothed high voltage. Alternatively thereto, the superposition voltage source is connected between the controllable voltage source and the ground potential. The use of a superposition voltage source is advantageous. The high voltage provided to a particle beam apparatus is composed in these exemplary embodiments of the sum of the stabilized smoothed high voltage and the voltage of the superposition voltage source. Because in the previously described exemplary embodiments a signal is always tapped upstream from the superposition voltage source for the stabilization of the smoothed high voltage, a change in the voltage of the superposition voltage source is not detected and is thus not suppressed by the stabilization of the high voltage.

The system described herein also relates to a method for generating a stable high voltage using a high-voltage DC generator, which has at least one of the above-mentioned features or a combination of the above-mentioned features. In the method, it is provided that the amplifier controls the controllable voltage source in counterphase and the stable high voltage is formed by the sum of the smoothed high voltage and the voltage provided by the controllable voltage source. In a further embodiment, the stable high voltage is formed with the help of the superposition voltage source by the sum of the stable smoothed high voltage and a voltage of the superposition voltage source.

BRIEF DESCRIPTION OF THE DRAWINGS

Embodiments of the system described herein are explained in greater detail based on the figures, which are briefly described as follows.

The system is described hereafter on the basis of a particle beam apparatus in the form of a transmission electron microscope (always designated TEM hereafter) and a scanning electron microscope (always designated SEM hereafter). However, it has already been indicated that the system described herein is not restricted to a TEM or an SEM. Rather, the system described herein is usable in any particle beam apparatus, for example, also in an ion beam apparatus.

Figure 1:
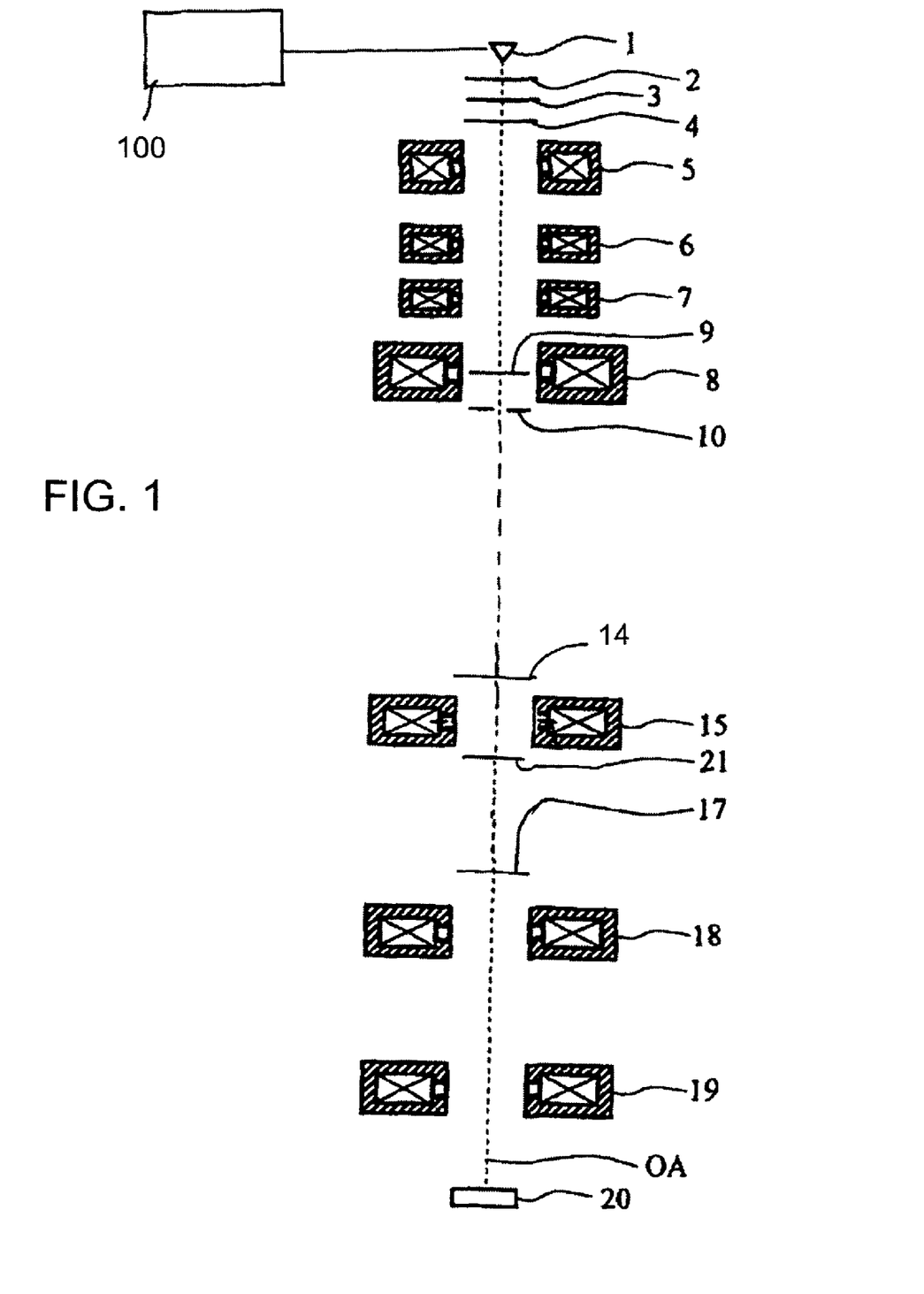
FIG. 1 shows a schematic view of a particle beam apparatus in the form of a transmission electron microscope according to an embodiment of the system described herein.

FIG. 1 shows a schematic view of a TEM. The TEM has an electron source 1 in the form of a thermal field emission source. However, another electron source is, of course, also usable. An extraction electrode 2, whose potential extracts electrons from electron source 1, is situated along the optical axis OA of the TEM downstream from electron source 1. Furthermore, a first electrode 3 for focusing the source location and a second electrode 4 for accelerating the electrons are provided. Because of second electrode 4, the electrons exiting from electron source 1 are accelerated to a desired and settable energy using an electrode voltage. For this purpose, electron source 1 is connected to a high-voltage DC generator 100, which is explained in greater detail below.

A multistage condensor, which has three magnetic lenses 5 through 7 (namely a first magnetic lens 5, a second magnetic lens 6, and a third magnetic lens 7), which is adjoined by an objective lens 8, which is provided in the form of a magnetic lens, is situated on the further course of optical axis OA. An object plane 9 is situated at objective lens 8, on which a sample to be studied may be situated using a sample manipulator. The illuminated field of object plane 9 is settable in particular by appropriate setting of the operating parameters (such as a lens current) of first magnetic lens 5, second magnetic lens 6, third magnetic lens 7, and objective lens 8.

A diffraction lens 15, which is implemented as a magnetic lens, is situated downstream from objective lens 8 in the direction opposite electron source 1. Diffraction lens 15 images a rear focal plane 10 of objective lens 8 in a diffraction intermediate image plane 21. Furthermore, objective lens 8 generates a real intermediate image 14 of object plane 9. Diffraction lens 15 images intermediate image 14 of object plane 9 in input image plane 17 of a projective system which includes a first projective lens 18 and a second projective lens 19. Projective system 18, 19 generates an image on a detector 20 of the sample which is situated in object plane 9 and imaged in input image plane 17 of projective system 18, 19. Through appropriate changeover of projective system 18, 19, it is also possible to a image rear focal plane 10 or diffraction intermediate image plane 21 on detector 20 (or in a final image plane). A TEM of this type may have further lenses and deflection and correction systems (such as stigmators or correctors) and/or spectrometers.

Figure 2:
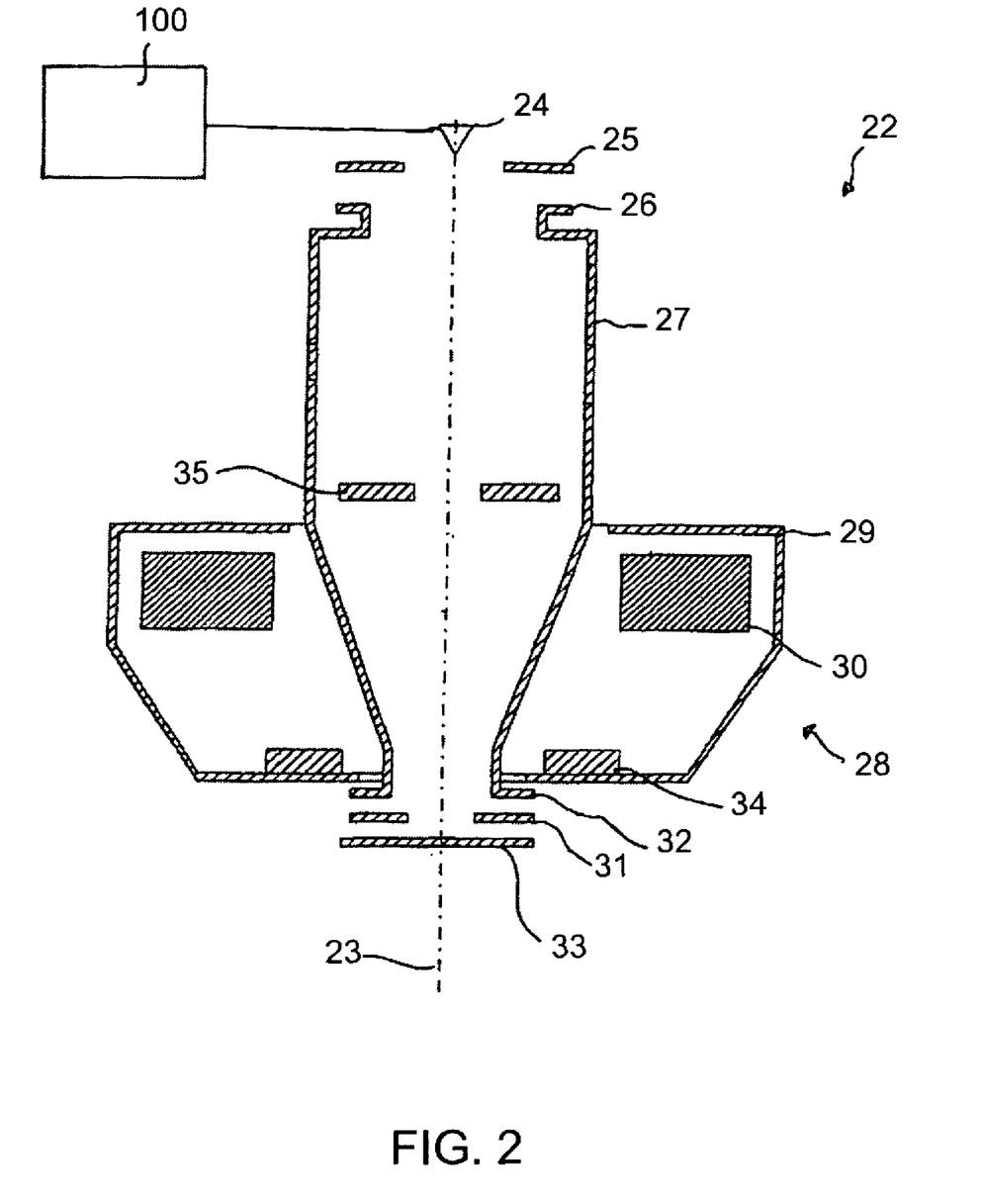
FIG. 2 shows a schematic view of a particle beam apparatus in the form of a scanning electron microscope according to an embodiment of the system described herein.

FIG. 2 shows a further particle beam apparatus in the form of an SEM, on which the system described herein may be implemented. The particle beam apparatus has an electron beam column 22, which is provided with an optical axis 23, a beam generator in the form of an electron source 24 (cathode), an extraction electrode 25, and an anode 26, which simultaneously forms one end of a beam guiding tube 27. For example, electron source 24 is a thermal field emitter. Electrons which are emitted from electron source 24 are accelerated to anode potential because of a potential difference between electron source 24 and anode 26. A particle beam in the form of an electron beam is accordingly provided. Electron source 24 is also connected to a high-voltage DC generator 100, which is explained in greater detail below, in this exemplary embodiment.

Furthermore, an objective lens 28 is provided, which has a hole through which beam guiding tube 27 passes. Objective lens 28 also has pole shoes 29, in which coils 30 are situated. An electrostatic deceleration apparatus is connected downstream from beam guiding tube 27, which includes a single electrode 31 and a tubular electrode 32. Tubular electrode 32 is at the end of beam guiding tube 27 opposite a support element 33. Support element 33 is used to receive an object to be studied.

Tubular electrode 32 is at anode potential together with beam guiding tube 27, while single electrode 31 and a sample situated on support element 33 are at a lower potential than the anode potential. In this way, the electrons of the particle beam may be decelerated to a desired energy, which is required for the study of a sample situated on support element 33. Electron beam column 22 also has scanning means 34, using which the electron beam may be deflected and scanned over a sample situated on support element 33.

For the imaging, secondary electrons and/or backscattered electrons, which arise because of the interaction of the electron beam with a sample situated on support element 33, are detected using a detector 35 situated in beam guiding tube 27. The signals generated by detector 35 are transmitted for imaging to an electronics unit (not shown).

Figure 3:
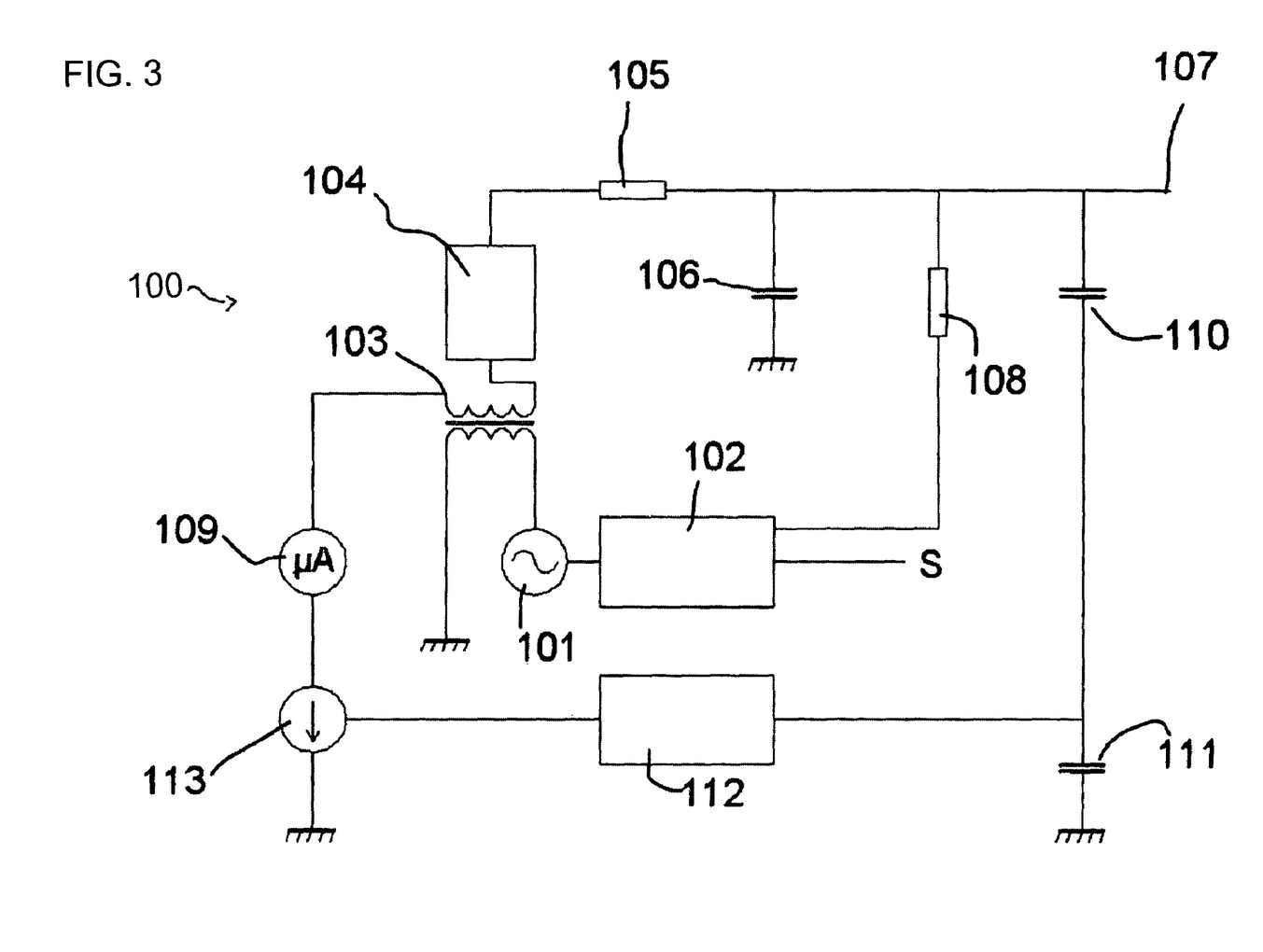
FIG. 3 shows a schematic view of a first embodiment of a high-voltage DC generator.

FIG. 3 shows a first exemplary embodiment of high-voltage DC generator 100, which is used, for example, in one of the two previously described particle beam apparatuses. High-voltage DC generator 100 has an AC voltage source 101, which is set by an amplitude regulator 102 via a target value S. Target value S is the high voltage to be achieved, which is to be supplied to the particle beam apparatus. The output voltage of AC voltage source 101 is supplied to a step-up transformer 103, which steps up the supplied output voltage of AC voltage source 101. A Cockcroft-Walton generator 104, which multiplies the transformed voltage supplied thereto, is connected downstream from step-up transformer 103. The high voltage resulting in this way is smoothed via a filter, which has a filter resistor 105 and a filter capacitor 106. In further embodiments, multiple filters may also be provided, which include filter resistors 105 and filter capacitors 106. The smoothed high voltage is supplied via a measuring resistor 108 to amplitude regulator 102. Fluctuations of the smoothed high voltage are detected via a capacitive divider including a first capacitor 110 and a second capacitor 111 and supplied to an amplifier 112. Amplifier 112 provides an output signal, which is applied to a controllable high-voltage source 113. A load current meter 109, which detects a high-voltage load current, is situated between controllable high-voltage source 113 and step-up transformer 103.

It is desirable to keep the frequency bandwidth of the suppressed fluctuations as large as possible. By appropriate implementation of filter resistor 105 and filter capacitor 106 (or by implementation of the filter resistors and filter capacitors in exemplary embodiments having more than one filter resistor and more than one filter capacitor), it is possible to suppress higher-frequency components of the fluctuations. In regard to the lower-frequency components of the fluctuations to be suppressed, it must be ensured that lower frequencies are always suppressed to a lesser degree by the lowpass filter, which is formed by filter resistor 105 and filter capacitor 106, and reach tap 107 of the high voltage.

For this reason, the fluctuations to be suppressed are to be detected by a capacitive divider. First capacitor 110 is implemented as high-voltage resistant. Second capacitor 111 has a significantly higher capacitance than first capacitor 110, at correspondingly lower voltage load. The lower limiting frequency, which determines a lower limit of the frequency bandwidth, is reduced due to the higher capacitance of second capacitor 111, so that with a corresponding implementation of second capacitor 111, slow changes (fluctuations) of the high voltage may also be detected by amplifier 112 and suppressed.

It is known that high-voltage resistant capacitors have rather large dimensions and are very costly, even for small capacitances. For this reason, it is advantageous in particular in the invention that through the use of the previously described capacitive divider, in addition to the input resistor of amplifier 112, second capacitor 111 (basically a low-voltage capacitor) is primarily used for the determination of the lower limiting frequency of the frequency bandwidth. An amplitude of the fluctuation, which decreases linearly as the divider ratio of the capacitance of second capacitor 111 to the capacitance of first capacitor 110 increases, may be compensated for by a higher gain of amplifier 112.

High-voltage DC generator 100 ensures that fluctuations of the smoothed high voltage are detected by capacitive divider 110, 111 and supplied to amplifier 112. Amplifier 112 controls controllable voltage source 113 in counterphase. The voltage of controllable voltage source 113 is supplied to the smoothed high voltage. The sum thus formed of the voltage of controllable voltage source 113 and the smoothed high voltage forms the generated and stabilized high voltage, which is supplied to the particle beam apparatus via a tap 107. It is advantageous for this purpose that, on the one hand, effective damping of interfering fluctuations of the smoothed high voltage is achieved. On the other hand, it is advantageous in that the dynamics of the stabilization are not limited by the bandwidth of amplitude regulator 102. Therefore, even higher-frequency interference may be effectively suppressed. Basically, any desired high voltage may be stabilized using the described device and the described method.

Figure 4:
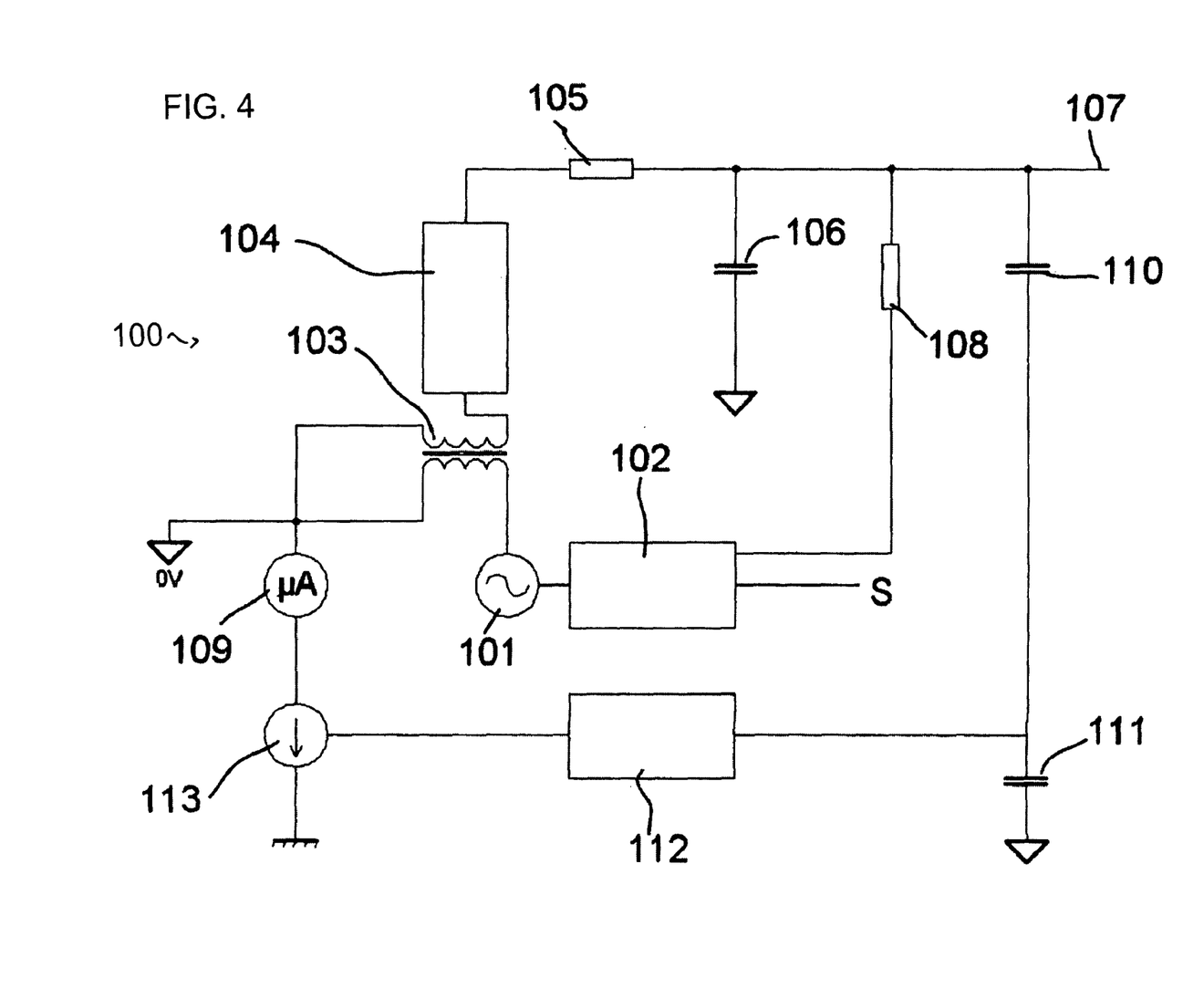
FIG. 4 shows a schematic view of a second embodiment of a high-voltage DC generator.

FIG. 4 shows a further embodiment of high-voltage DC generator 100. Identical components are provided with identical reference numerals as in FIG. 3. The exemplary embodiment according to FIG. 4 substantially corresponds to the exemplary embodiment according to FIG. 3. In contrast to the exemplary embodiment according to FIG. 3, capacitive divider 110, 111 of the exemplary embodiment according to FIG. 4 is designed in such a way that the fluctuations of the smoothed high voltage are detected in relation to a virtual ground. For example, an internal apparatus reference signal is provided as the virtual ground, which is designated by 0 V, i.e., the regulator reference point. The reference point of the signal of target value S is also the virtual ground designated by 0 V in this case. This is illustrated once again in FIG. 4A. The exemplary embodiment of FIG. 4A corresponds to the exemplary embodiment of FIG. 4, the reference point being shown in FIG. 4A. The fluctuations detected in relation to this virtual ground are supplied to amplifier 112. The amplifier in turn controls controllable voltage source 113, whose output-side reference point is the ground potential, in counterphase. In the previously described embodiment, the fluctuations of the smoothed high voltage are damped sufficiently well. In addition, the suppressed fluctuations of the stabilized high voltage may still be detected in their entirety by the capacitive divider.

Figure 4A:
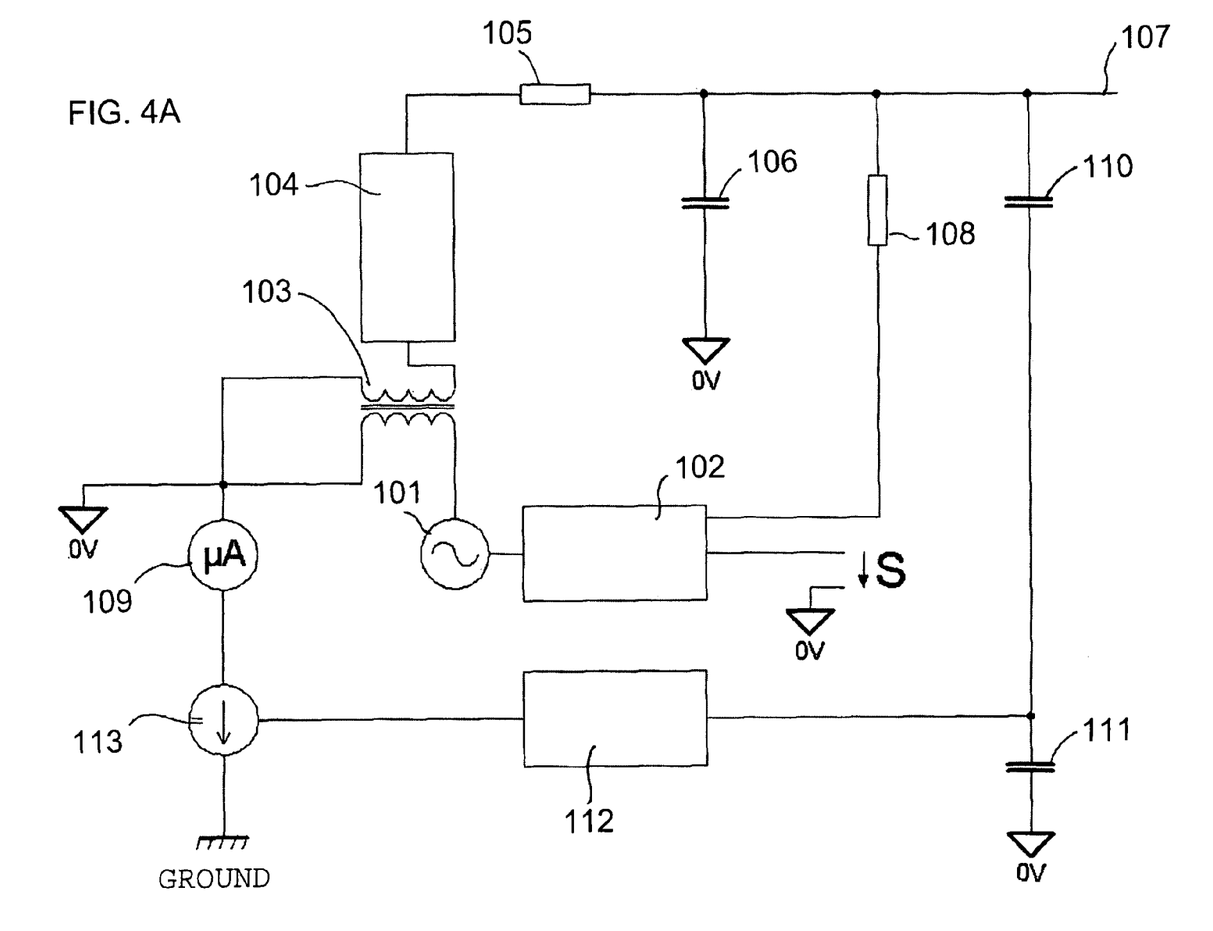
FIG. 4A shows a schematic view of the second embodiment of a high-voltage DC generator having a virtual ground.

The sum of the fluctuations of the high-voltage source in relation to the virtual ground and the fluctuation of controllable voltage source 113 in relation to ground become practically zero. Because the sum of these two voltage sources represents the used voltage, it is thus stabilized. A more precise value of the total gain, which is formed from the product of the gains by amplifier 112 and controllable voltage source 113, is calculated for the optimum damping of the fluctuations. This is equal to the negative divider ratio of second capacitor 111 and first capacitor 110. The product of the divider ratio and the total gain is thus precisely −1.

Figure 5:
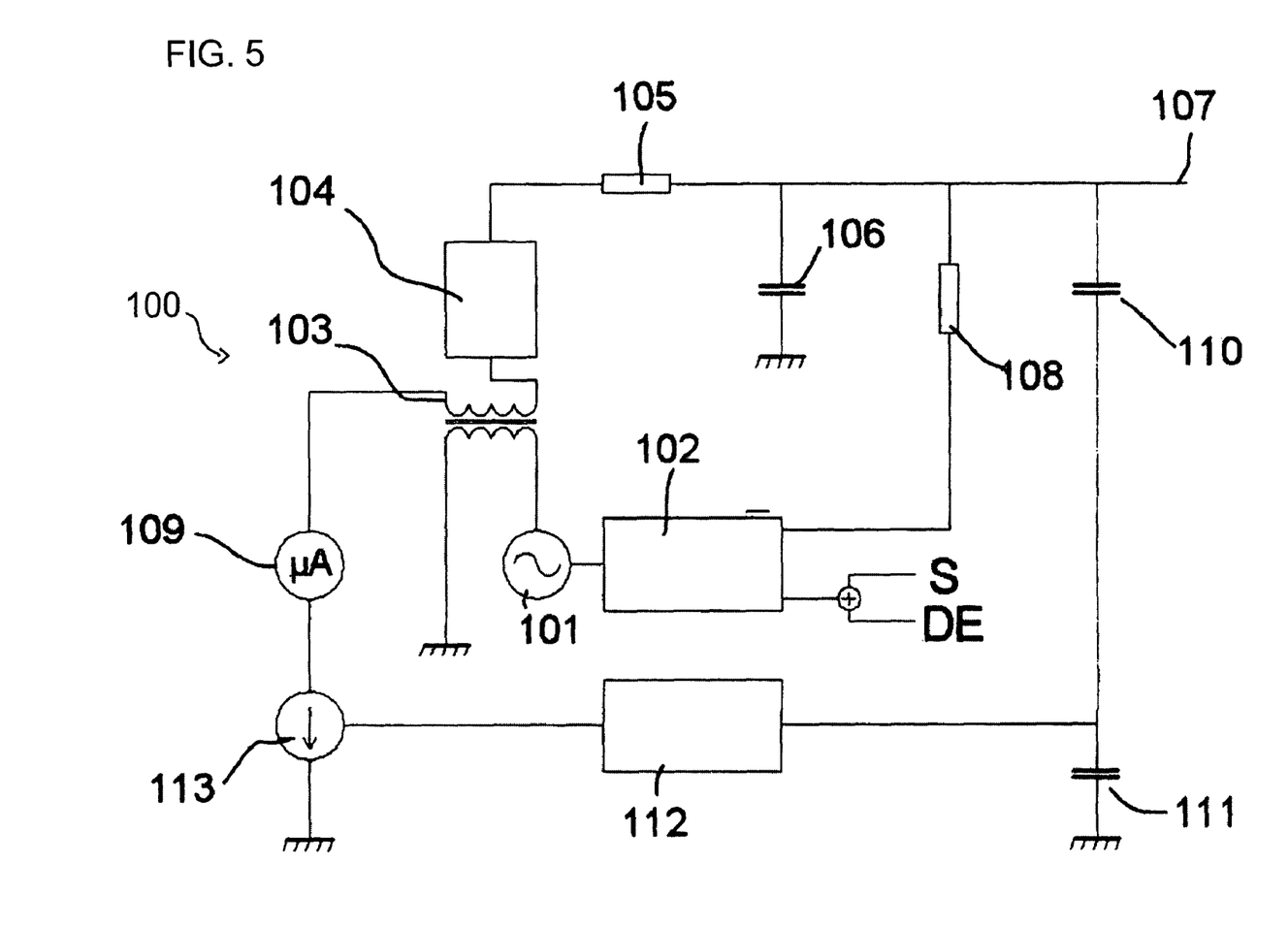
FIG. 5 shows a schematic view of a third embodiment of a high-voltage DC generator.

FIG. 5 shows a further embodiment of high-voltage DC generator 100. Identical components are again provided with identical reference numerals. The exemplary embodiment according to FIG. 5 basically corresponds to the exemplary embodiment according to FIG. 3. In contrast to the exemplary embodiment according to FIG. 3, amplitude regulator 102 is not only controlled by target value S of the desired high voltage, but rather also using a target value DE for a value, by which the desired high voltage is to be changed. The signals for target value S and for target value DE are added. The above-mentioned embodiment has all the advantages of the system described herein; however, it is not suitable for all forms of use. This is because a desired change DE is also considered here in the stabilization as an undesired fluctuation. It is therefore initially suppressed. A desired value of the high voltage is therefore only achieved after a relatively long time.

Figure 6:
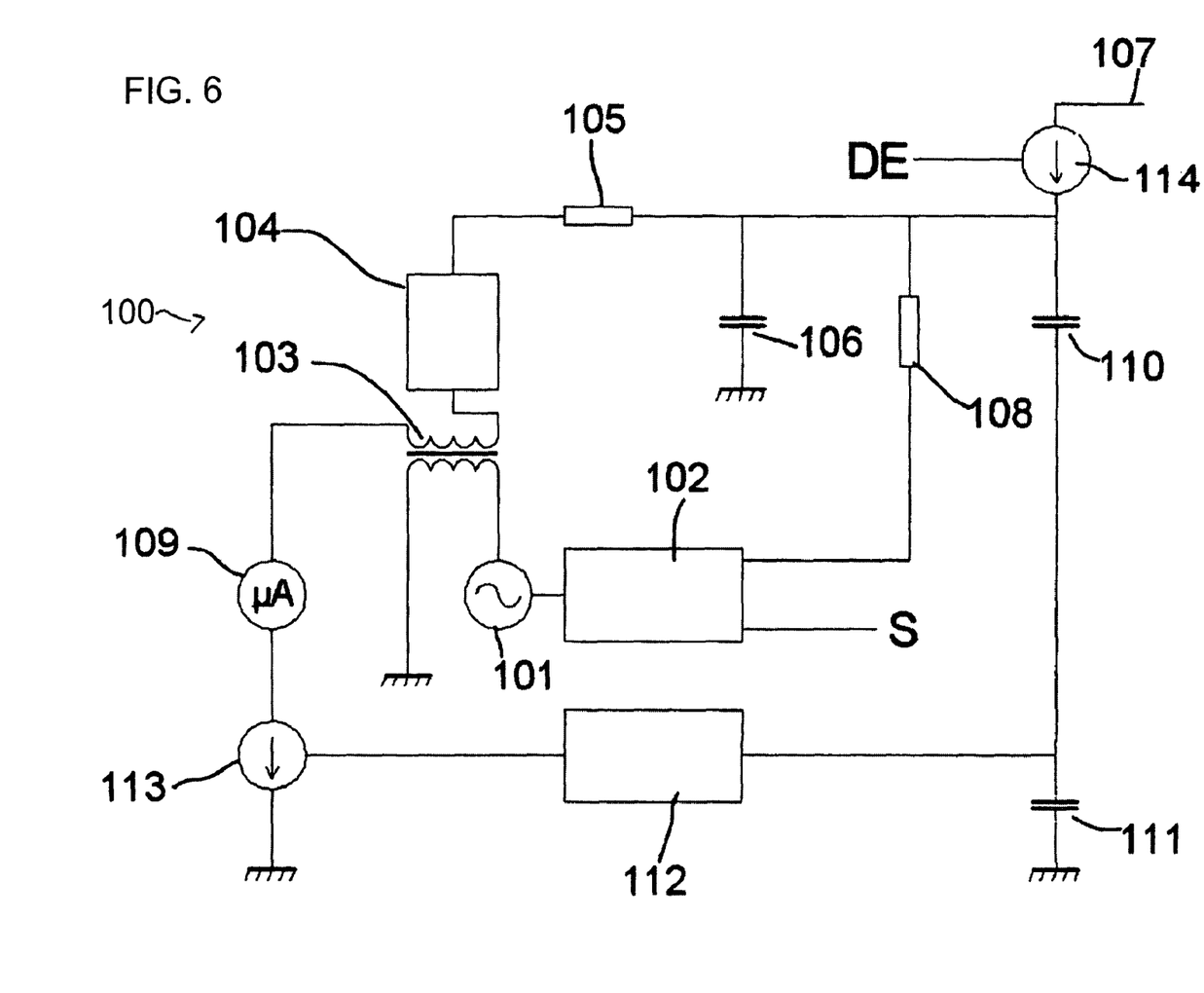
FIG. 6 shows a schematic view of a fourth embodiment of a high-voltage DC generator.
Figure 7:
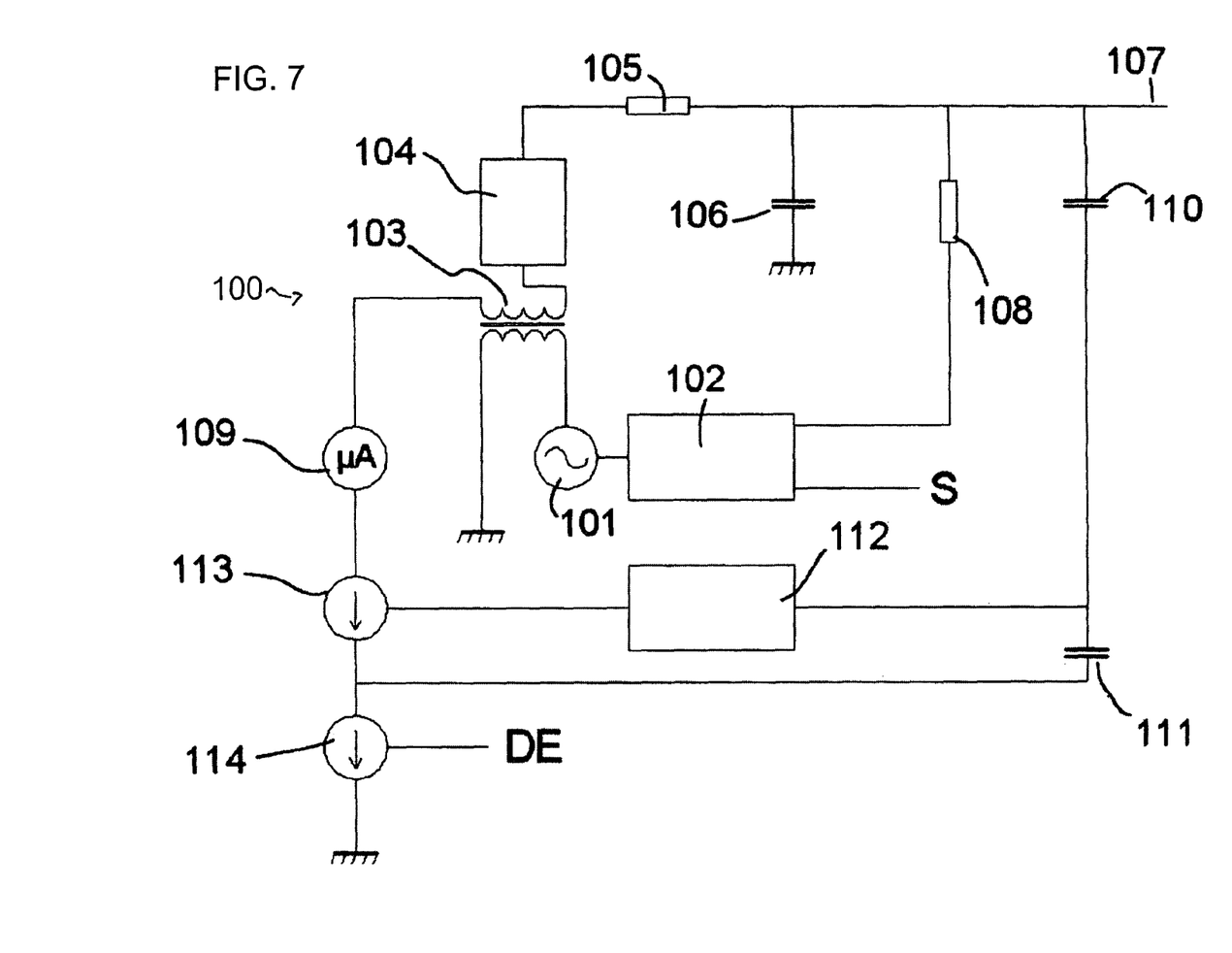
FIG. 7 shows a schematic view of a fifth embodiment of a high-voltage DC generator.

The described disadvantages in regard to the embodiment of FIG. 5 are avoided by the exemplary embodiment according to FIG. 6 and the exemplary embodiment according to FIG. 7. Identical components are again provided with identical reference numerals. In contrast to the exemplary embodiment according to FIG. 5, in the exemplary embodiment according to FIG. 6, a superposition voltage source in the form of a voltage source 114 for superimposing the smoothed high voltage is to be used. Voltage source 114 specifies value DE, by which the high voltage is to be changed. Voltage source 114 is connected between capacitive divider 110, 111 and tap 107 of the stabilized high voltage. FIG. 7 shows an alternative configuration of voltage source 114, namely between controllable voltage source 113 and the ground potential. The use of the above-mentioned superposition voltage source is advantageous. The high voltage provided to a particle beam apparatus is composed in these exemplary embodiments of the sum of the smoothed high voltage and the voltage of voltage source 114. Because a signal for the stabilization for the smoothed high voltage is always tapped upstream from voltage source 114 in the previously described exemplary embodiments, a change in the voltage of voltage source 114 is not detected and is thus not suppressed upon the stabilization.

Figure 6A:
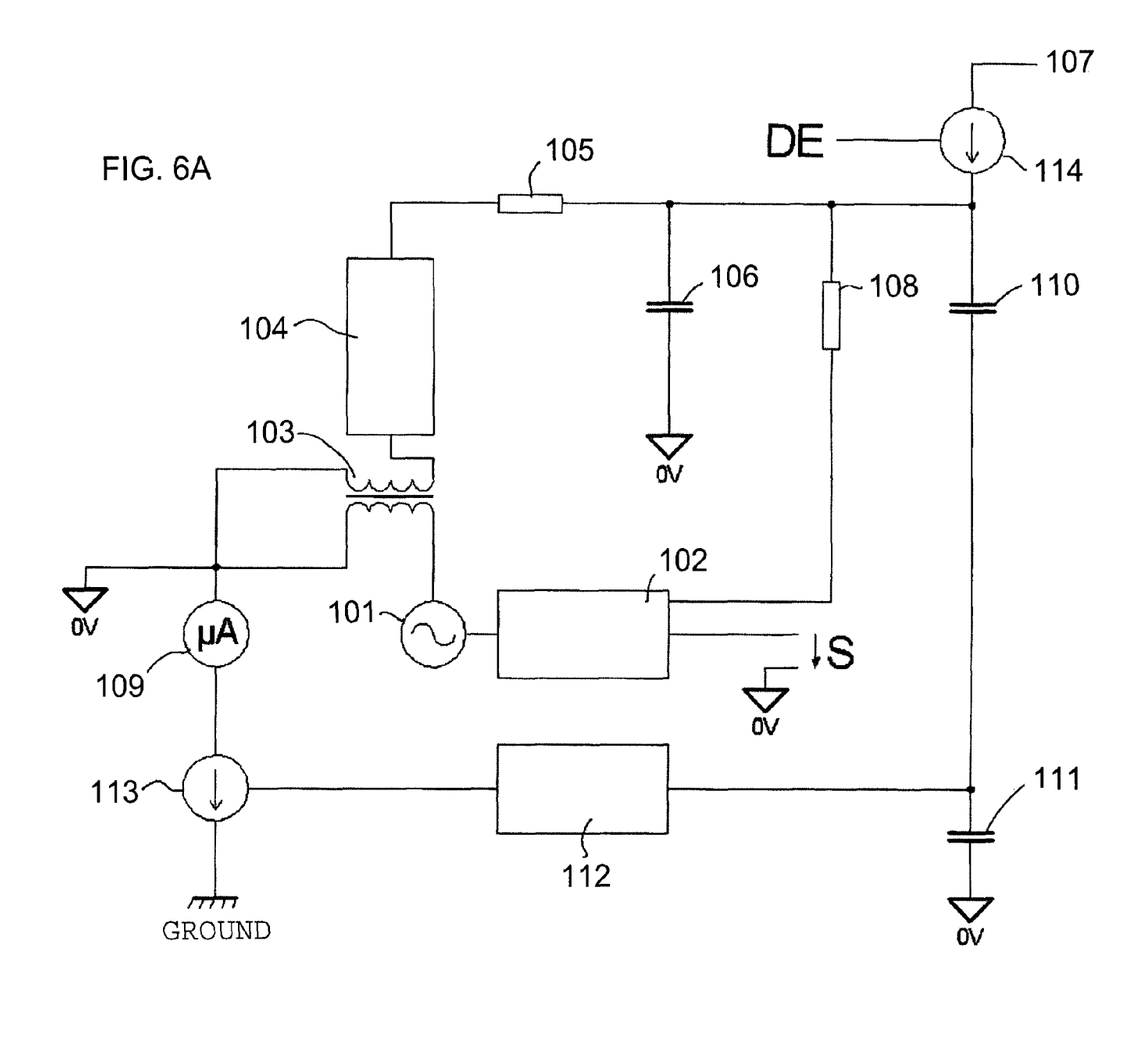
FIG. 6A shows a schematic view of the fourth embodiment of a high-voltage DC generator having a virtual ground.
Figure 7A:
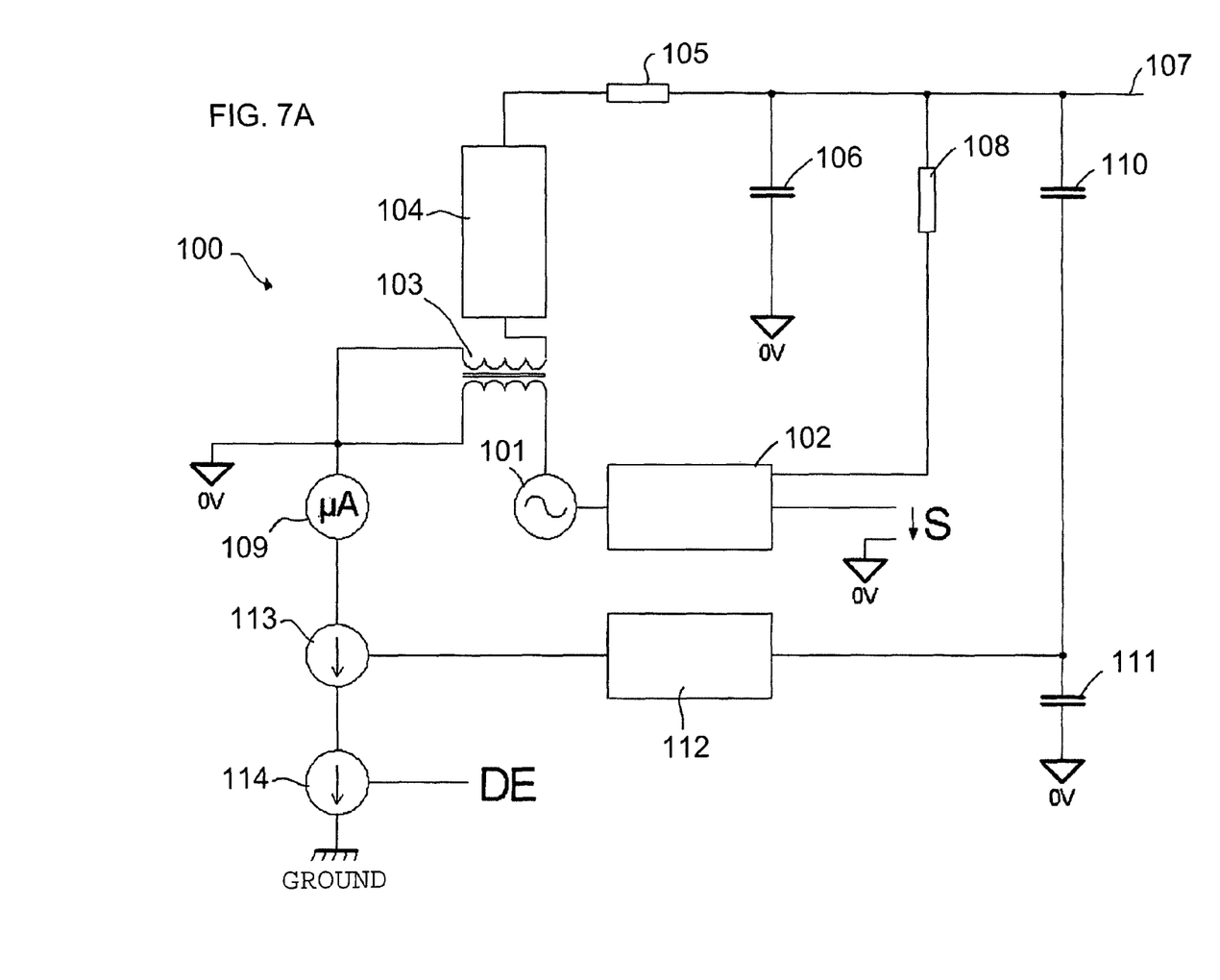
FIG. 7A shows a schematic view of the fifth embodiment of a high-voltage DC generator having a virtual ground.

For the sake of completeness, it is to be noted that the use of a separate voltage source for desired changes (DE) of the high voltage is also advisable in stabilized high voltage generators having virtual ground. Exemplary embodiments which take this into account are shown in FIGS. 6A and 7A. The exemplary embodiment of FIG. 6A is based on the exemplary embodiment of FIG. 6. Identical components are provided with identical reference numerals. The exemplary embodiment of FIG. 7A is based on the exemplary embodiment of FIG. 7. Also here, identical components are provided with identical reference numerals.

For the sake of good order, it is to be noted that in further exemplary embodiments (not shown, however), in the TEM according to FIG. 1 high-voltage DC generator 100 is connected to extraction electrode 2, first electrode 3 and second electrode 4, each via further control units. In a still further exemplary embodiment, in the SEM according to FIG. 2, extraction electrode 25, anode 26, and beam guiding tube 27 are also connected each via further control units to high-voltage DC generator 100. The potentials of the above-mentioned units which are connected to high-voltage DC generator 100 thus depend on the high voltage at tap 107 of the high voltage.

Various embodiments discussed herein may be combined with each other in appropriate combinations in connection with the system described herein. Additionally, in some instances, the order of steps in the flow charts or flow diagrams may be modified, where appropriate. Further, various aspects of the system described herein may be implemented using software, hardware, and/or a combination of software and hardware. Software implementations of the system described herein may include executable code that is stored in a computer readable storage medium and executed by one or more processors. The computer readable storage medium may include a computer hard drive, ROM, RAM, flash memory, portable computer storage media such as a CD-ROM, a DVD-ROM, a flash drive and/or other drive with, for example, a universal serial bus (USB) interface, and/or any other appropriate tangible storage medium or computer memory on which executable code may be stored and executed by a processor. The system described herein may be used in connection with any appropriate operating system.

Other embodiments of the invention will be apparent to those skilled in the art from a consideration of the specification or practice of the invention disclosed herein. It is intended that the specification and examples be considered as exemplary only, with the true scope and spirit of the invention being indicated by the following claims.

The invention claimed is:

1. A high-voltage DC generator for a particle beam apparatus, comprising:
 at least one Cockroft-Walton generator,
 at least one AC voltage source for supplying the Cockroft-Walton generator,
 at least one amplitude regulator for setting the AC voltage source,
 at least one step-up transformer, which is connected to the AC voltage source to supply the step-up transformer with an output voltage of the AC voltage source,
 at least one filter element for smoothing a high voltage generated by the Cockroft-Walton generator,
 at least one measuring resistor for supplying the high voltage smoothed by the filter element to the amplitude regulator, at least one capacitive divider for detecting fluctuations of the smoothed high voltage, at least one amplifier, which is connected to the capacitive divider to receive the detected fluctuations of the smoothed high voltage, wherein a controllable voltage source is provided, which is connected to the amplifier.

2. The high-voltage DC generator as recited in claim 1, wherein at least one current meter is provided for detecting a high-voltage load current, the step-up transformer being connected to the current meter.

3. The high-voltage DC generator as recited in claim 1, wherein an output-side reference point of the controllable voltage source is the ground potential.

4. The high-voltage DC generator as recited in claim 1, wherein the capacitive divider is designed in such a way that the fluctuations of the smoothed high voltage are detected in relation to the ground potential.

5. The high-voltage DC generator as recited in claim 1, wherein the capacitive divider is designed in such a way that the fluctuations of the smoothed high voltage are detected in relation to a virtual ground.

6. The high-voltage DC generator as recited in claim 1, wherein the amplitude regulator is settable using a target value for a desired high voltage.

7. The high-voltage DC generator as recited in claim 1, wherein the amplitude regulator is settable using a target value of a value for a change in the high voltage.

8. The high-voltage DC generator as recited in claim 1, wherein a superposition voltage source is provided for superimposing the smoothed high voltage.

9. The high-voltage DC generator as recited in claim 8, wherein the superposition voltage source is connected between the capacitive divider and a tap of the smoothed high voltage.

10. The high-voltage DC generator as recited in claim 8, wherein the superposition voltage source is connected between the controllable voltage source and the ground potential.

11. A method for generating a stable high voltage using a high-voltage DC generator, comprising:

at least one AC voltage source supplying a Cockroft-Walton generator, at least one amplitude regulator setting the AC voltage source, connecting at least one step-up transformer to the AC voltage source to supply the step-up transformer with an output voltage of the AC voltage source, at least one filter element smoothing a high voltage generated by the Cockroft-Walton generator, at least one measuring resistor supplying the high voltage smoothed by the filter element to the amplitude regulator, at least one capacitive divider detecting fluctuations of the smoothed high voltage, an amplifier, connected to the capacitive divider to receive the detected fluctuations of the smoothed high voltage, controlling a controllable voltage source in counterphase, and forming a stable high voltage by the sum of a smoothed high voltage and a voltage provided by the controllable voltage source.

12. The method as recited in claim 11, wherein the stable high voltage is formed using a superposition voltage source by a sum of the stable smoothed high voltage and a voltage of the superposition voltage source.

13. A method for generating a stable high voltage, comprising:

providing a high voltage generator for generating a high voltage, providing a controllable voltage source, smoothing the high voltage generated by the high voltage generator, detecting fluctuations of the smoothed high voltage using a capacitive divider, amplifying the detected fluctuations with an amplifier, controlling the controllable voltage source by the amplified detected fluctuations in counterphase, and forming a stable high voltage by the sum of the smoothed high voltage and a voltage provided by the controllable voltage source.

* * * * *